United States Patent
Ruby et al.

[11] Patent Number: 5,883,575
[45] Date of Patent: Mar. 16, 1999

[54] RF-TAGS UTILIZING THIN FILM BULK WAVE ACOUSTIC RESONATORS

[75] Inventors: Richard C. Ruby, Menlo Park; Philip Canfield, Santa Rosa, both of Calif.

[73] Assignee: Hewlett-Packard Company, Palo Alto, Calif.

[21] Appl. No.: 909,677

[22] Filed: Aug. 12, 1997

[51] Int. Cl.[6] .................................................. G08B 13/14
[52] U.S. Cl. .................................. 340/572.5; 310/313 R; 333/187
[58] Field of Search ............................. 340/572, 825.34, 340/572.5; 367/180; 310/313 R; 333/187

[56] References Cited

U.S. PATENT DOCUMENTS

| | | | |
|---|---|---|---|
| 2,976,501 | 3/1961 | Mattiat | 333/187 X |
| 3,755,803 | 8/1973 | Cole et al. | 340/572 |
| 5,034,753 | 7/1991 | Weber | 333/187 X |
| 5,359,250 | 10/1994 | Toda | 310/313 R |
| 5,382,930 | 1/1995 | Stokes et al. | 333/191 |
| 5,446,306 | 8/1995 | Stokes et al. | 257/416 |
| 5,587,620 | 12/1996 | Ruby et al. | 310/346 |

Primary Examiner—Thomas J Mullen, Jr.

[57] ABSTRACT

An RF tag having an antenna for receiving a RF signal having a frequency band between first and second frequencies and an acoustical resonator having a resonant frequency related to the first and second frequencies. The acoustical resonator has first and second electrodes that sandwich a layer of piezoelectric material. The antenna is connected to one of these electrodes. The resonator filters the signal received on the antenna. The filter can function either as a notch filter or as a bandpass filter. A resonator that acts as a bandpass filter includes a third electrode and a second layer piezoelectric material sandwiched between the second electrode and the third electrode. A frequency multiplier circuit may be incorporated in the RF tag to provide a response signal that occupies a frequency band at a frequency above the second frequency. In one embodiment of the present invention, multiple resonators having different resonant frequencies are utilized to generate a response code. In one embodiment of the present invention, the resonators are suspended on a support member over a substrate at locations on the support member which differ in thickness.

13 Claims, 8 Drawing Sheets

RF-TAGS UTILIZING THIN FILM BULK WAVE ACOUSTIC RESONATORS

FIELD OF THE INVENTION

The present invention relates to RF communications, and more particularly, to transponders which broadcast response codes in response to receiving an interrogation signal.

BACKGROUND OF THE INVENTION

Various systems use transponders to identify objects from a distance by associating a transponder with the object. The transponders are programmed with unique identification codes that identify the object. Typically, an interrogator transmits an interrogation signal. When a transponder receives the interrogation signal, it responds by broadcasting its unique identification code. The interrogator identifies the transponder and the object with which it is associated by detecting this identification code.

The high cost, excessive bulk and poor reliability of conventional transponders prevent their use in numerous applications. A highly reliable, small transponder which may be provided at such a low cost that it may be regarded as a simple "tag" is needed to permit these and many other applications to identify objects from a distance. These applications may include, for example, tags for identifying luggage, employees, vehicles, and goods in inventory.

While transponders that include a power source have improved range, these transponders are more expensive and less reliable than passive transponders. Passive transponders obtain the energy required for their operation from the interrogation signal itself For example, the response signal may be broadcast by modulating the reflectivity of the transponder to the interrogation signal rather than by actively sourcing and radiating an RF signal.

Such conventional transponders use an antenna printed on one portion of the circuit board and mount various discrete, individually packaged electrical components, such as semiconductor chips, diodes, resistors, capacitors, inductors and the like on remaining portions of the circuit board. The antenna size is limited by the available circuit board area which must be shared with the electrical components. An efficient antenna must have dimensions that are determined by the frequency of the interrogation signal. To provide a compact transponder, the transponder must operate at very high frequencies, typically in the GHz region. Individual components are poorly suited for operation at these high frequencies.

As noted above, each tag must respond with a response signal that identifies the tag. In some applications, a number of identical tags may be deployed; in other applications, each tag must have a unique response signal. Accordingly, it would be advantageous to be able to provide a single tag design that can be easily programmed with its identification code.

Finally, as noted above, the cost of manufacturing tags has limited the use of radio tags. It would be advantageous to be able to manufacture radio tags as single chips using conventional semiconductor manufacturing techniques.

Broadly, it is the object of the present invention to provide an improved radio tag.

It is a further object of the present invention to provide a radio tag that operates at high frequencies.

It is yet another object of the present invention to provide a radio tag that does not require discrete components.

It is a still further object of the present invention to provide an inexpensive method for making a radio tag.

These and other objects of the present invention will become apparent to those skilled in the art from the following detailed description of the invention and the accompanying drawings.

SUMMARY OF THE INVENTION

The present invention comprises an RF tag having an antenna for receiving an RF signal having a frequency band between first and second frequencies and an acoustical resonator having a resonant frequency related to the first and second frequencies. The acoustical resonator has first and second electrodes that sandwich a layer of piezoelectric material. The antenna is connected to one of these electrodes. The resonator filters the signal received on the antenna. The filter can function either as a notch filter or as a bandpass filter. A resonator that acts as a bandpass filter includes a third electrode and a second layer piezoelectric material sandwiched between the second electrode and the third electrode. A frequency multiplier circuit may be incorporated in the RF tag to provide a response signal that occupies a frequency band at a frequency above the second frequency. In one embodiment of the present invention, multiple resonators having different resonant frequencies are utilized to generate a response code. In one embodiment of the present invention, the resonators are suspended on a support member over a substrate at locations on the support member which differ in thickness.

DETAILED DESCRIPTION OF THE INVENTION

Figure 1:
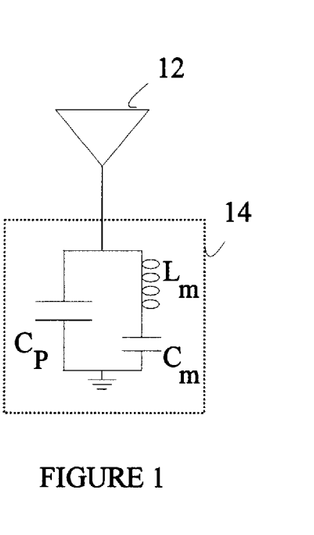
FIG. 1 is a schematic drawing of one embodiment of a RF tag according to the present invention.
Figure 2:
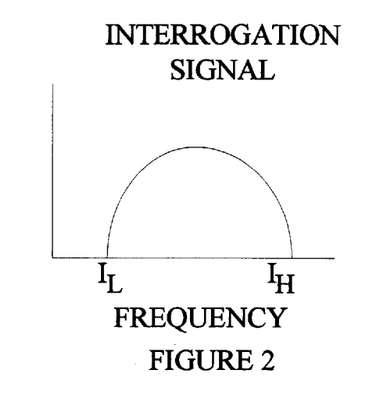
FIG. 2 illustrates a typical interrogation signal which is a relatively broad-band signal.
Figure 3:
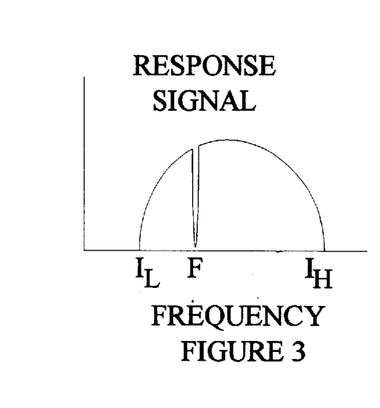
FIG. 3 illustrates a response signal that is generated by notch filtering the interrogation signal shown in FIG. 2.

The present invention utilizes a thin film bulk acoustic resonator (FBAR) to modify the interrogation signal thereby providing a unique RF signal that identifies the tag. Refer now to FIG. 1 which is a schematic drawing of one embodiment of a RF tag according to the present invention. RF tag 10 receives an interrogation signal on antenna 12. The interrogation signal is a relatively broad-band signal extending from a low frequency of $I_L$ to a high frequency of $I_H$ as shown in FIG. 2. Antenna 12 is connected to a tank circuit 14 which absorbs energy at frequency F. As a result, the signal that is re-radiated by RF tag 10 is notch filtered as shown in FIG. 3. The interrogator identifies the RF tag by the position of the notch.

Figure 4:
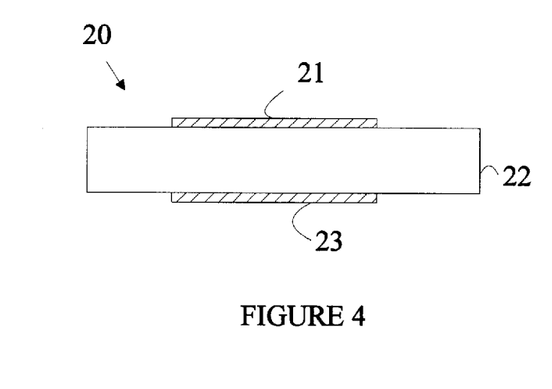
FIG. 4 is a schematic drawing of a cross-sectional view of one embodiment of an acoustical resonator according to the present invention.

In the present invention, the notch filter is constructed from a thin film bulk acoustic resonator (FBAR). Refer now to FIG. 4 which is a cross-sectional view of an FBAR 20. FBAR 20 includes bottom and top electrodes 23 and 21, respectively, which sandwich a portion of a sheet of piezoelectric (PZ) material 22. The preferred PZ material is aluminum nitride, AlN. The electrodes used in resonator 10 will be assumed to be made from aluminum; however, embodiments employing other materials may also be used.

These devices use bulk longitudinal acoustic waves in the thin film PZ material. When an electric field is created between the two electrodes via an impressed voltage, the PZ material converts some of the electrical energy into mechanical energy in the form of sound waves. The sound waves propagate in the same direction as the electric field and reflect off of the electrode/air interface.

At the mechanical resonance, the device appears to be an electronic resonator; hence, the device can act as a notch filter. The mechanical resonant frequency is the frequency for which the half wavelength of the sound waves propagating in the device is equal to the total thickness of the device for a given phase velocity of sound in the material. Since the velocity of sound is many orders of magnitude smaller than the velocity of light, the resulting resonator can be quite compact. Resonators for applications in the GHz range may be constructed with physical dimensions less than 100 μm in diameter and few μm in thickness.

Figure 5:
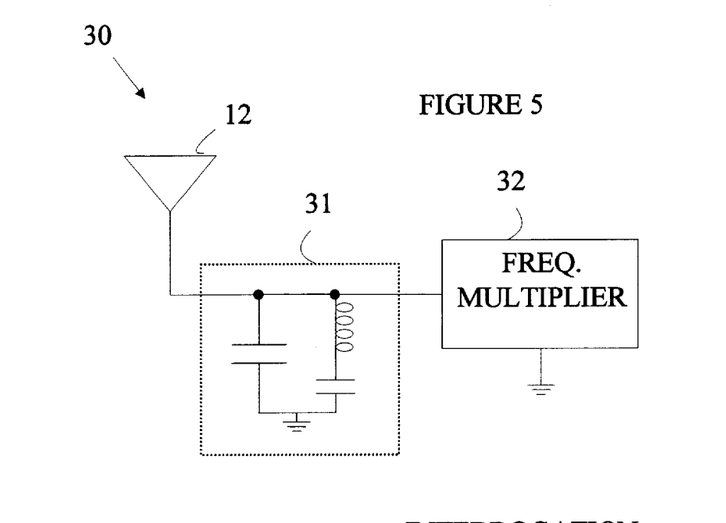
FIG. 5 is a schematic drawing of an embodiment of a RF tag according to the present invention which utilizes an acoustic resonator to process the interrogation signal received by an antenna.
Figure 6:
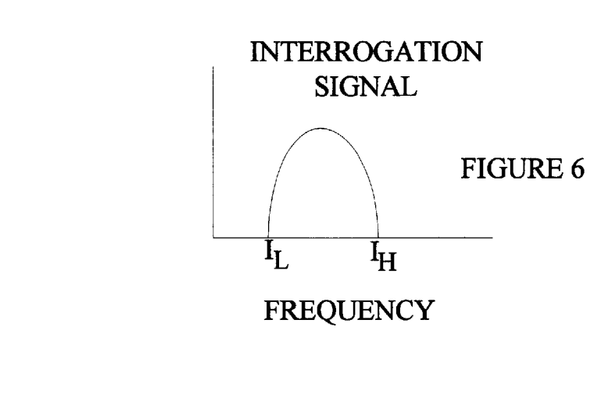
FIG. 6 illustrates a broad band interrogation signal.
Figure 7:
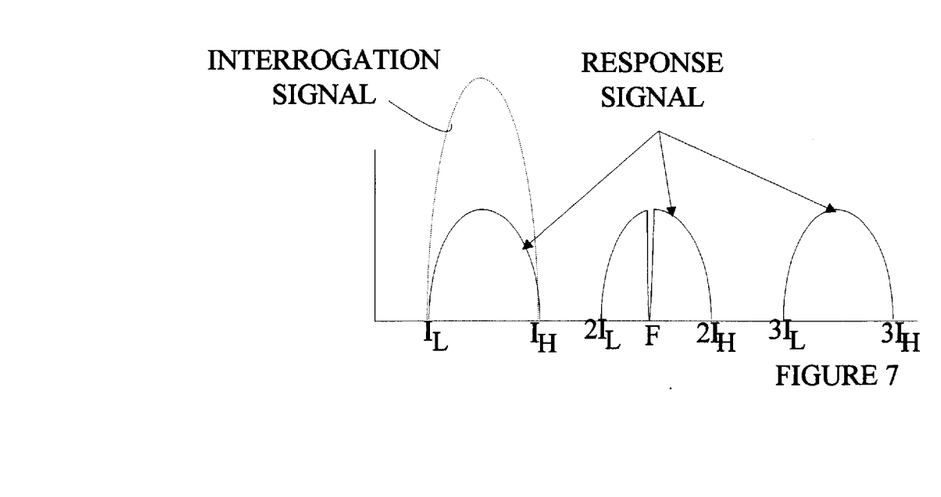
FIG. 7 illustrates the output signal generated by the RF tag shown in FIG. 5.

Refer now to FIG. 5 which is a schematic drawing of an embodiment of a RF tag 30 according to the present invention which utilizes a resonator 31 and a frequency multiplier circuit 32 to process the interrogation signal received by an antenna 12. Resonator 31 is preferably an FBAR as described above. Frequency multiplier circuit 32 generates copies of the interrogation signal at integer multiples of the interrogation signal as shown in FIG. 6. Frequency multiplier 32 may be constructed from zero bias diodes, and hence, does not require a power source. The resonance frequency of resonator 31 is chosen to lie in one of the higher frequency images. For the purposes of the present discussion, it is assumed that resonator 31 has its resonant frequency, F, between $2I_L$ and $2I_H$. The output signal generated by RF tag 30 is shown in FIG. 6.

The use of frequency multiplier 32 reduces any problems resulting from the frequency overlap between the interrogation signal and the response signal. If the RF tag is near an object which strongly reflects the interrogation signal, the reflected signal can reach the interrogator with an amplitude of the same order of magnitude as the response signal from the RF tag. This background signal can interfere with the detection of the response signal. By moving the response signal to a higher frequency, such interference is avoided.

There are a number of applications in which it is advantageous to provide a set of RF tags in which each radio tag has a unique identification number which can be detected by the interrogator. For example, personnel ID badges can be constructed from such a set of RF tags. For the purposes of this discussion, it will be assumed that only one RF tag is in the field of view of the interrogator at a given time. In principle, such a set of RF tags could be constructed by using the embodiment shown in FIG. 5 with a different resonant frequency for each tag. However, as the number of tags in the set becomes large, the separation between the various frequencies becomes too small to provide reliable detection.

Figure 8:
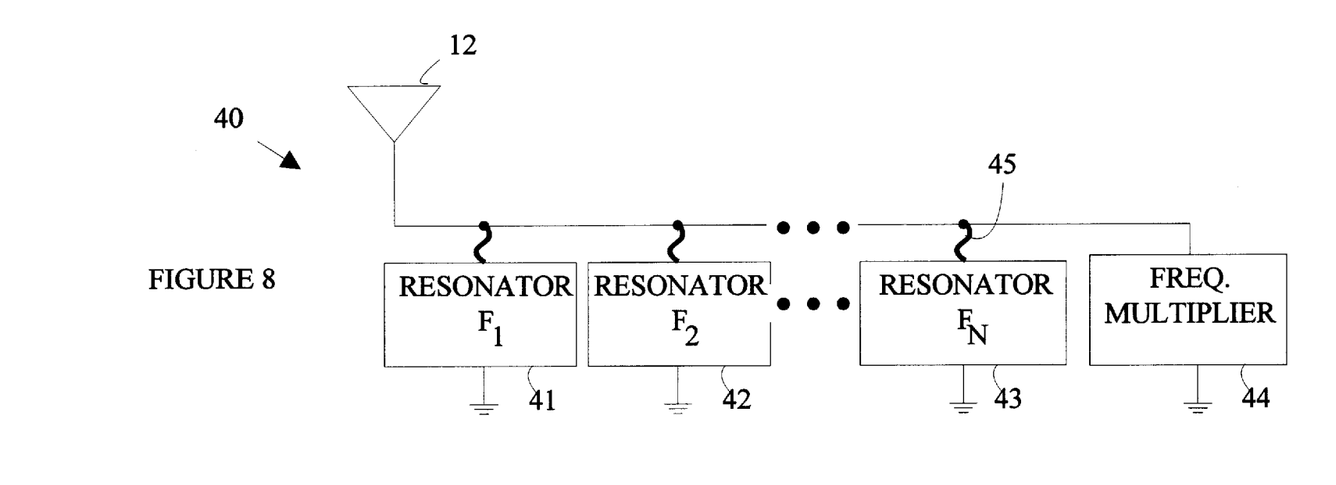
FIG. 8 is a block diagram of an RF tag according to the present invention having multiple FBAR resonators.
Figure 9:
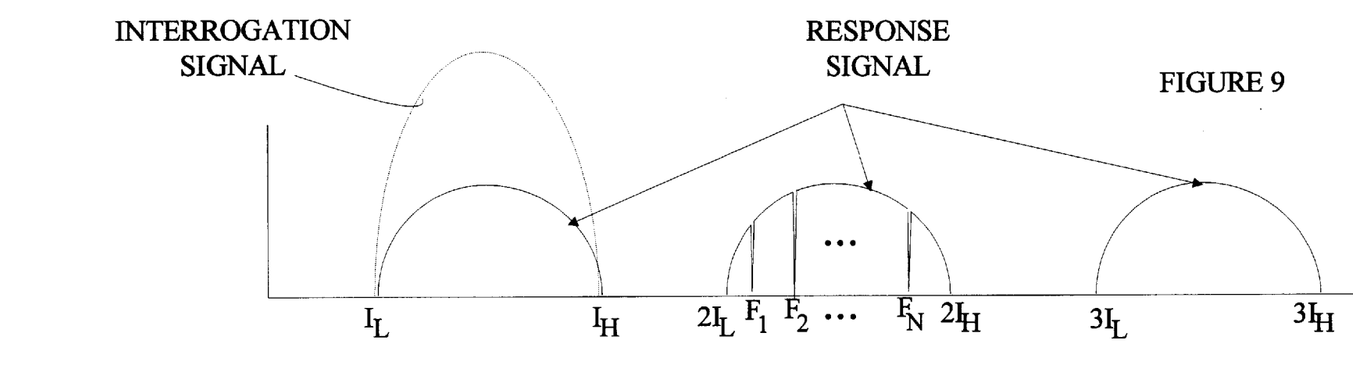
FIG. 9 illustrates the output signal generated by the RF tag shown in FIG. 8.

However, by using multiple resonators in each RF tag, each tag can be made to transmit a unique binary encoded identification signal. Such an arrangement is shown in FIG. 8 which is a block diagram of an RF tag 40 constructed from N FBAR resonators. Exemplary resonators are shown at 41–43. Each resonator absorbs energy at a unique frequency. The absorption frequency of the $i^{th}$ resonator is denoted by $F_i$. For the purposes of this discussion, all of the resonant frequencies are assumed to be within one of the high frequency signal images generated by frequency multiplier 44. The output of RF tag 40 when all of the resonators are connected to antenna 12 is shown in FIG. 9. By disconnecting one or more of the resonators from the antenna, a binary encoded identification signature can be created. The presence of a particular absorption band indicates a "1," and the absence of such a band indicates a "0" for the corresponding bit of the identification number. In the embodiment shown in FIG. 8, each of the resonators is connected to the antenna by a fuse 45 which may be blown by connecting the RF tag to an appropriate programming device.

In the preferred embodiment of the present invention as shown in FIG. 8, the lowest and highest frequency resonators are always connected. This arrangement provides two calibration peaks at the extremes of the frequency band in which the other peaks may be present or absent depending on the identification number. It is known that the resonant frequency of an FBAR will shift with temperature. These calibration peaks allow the interrogator to correct for any such shift. In this case, the actual identification number is limited to N-2 bits.

Refer again to FIG. 1 which illustrates the equivalent circuit for an antenna connected to an FBAR. To provide the most pronounced absorption at the resonant frequency, the antenna load, $Z_0$, must satisfy the condition:

$$Z_0 C_P << \sqrt{L_M C_M}$$

The circuit parameters are related to the area of the FBAR layers. Hence, in the preferred embodiment of the present invention, the device areas are chosen such that Eq(1) is satisfied. In practice, the device areas are chosen such that:

$$Z_0 C_P < 5 \sqrt{L_M C_M}$$

Figure 10:
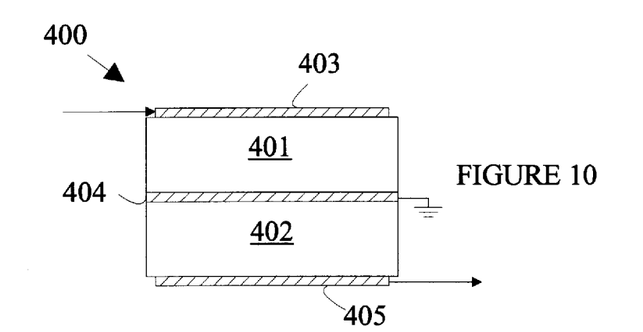
FIG. 10 is a cross-sectional view of a resonator that may be utilized to implement a bandpass filter.
Figure 11A:
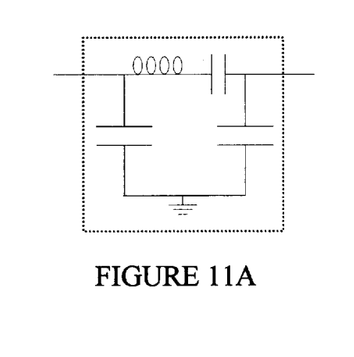
FIG. 11A is the electrical equivalent circuit of the bandpass filter shown in FIG. 10.
Figure 11B:
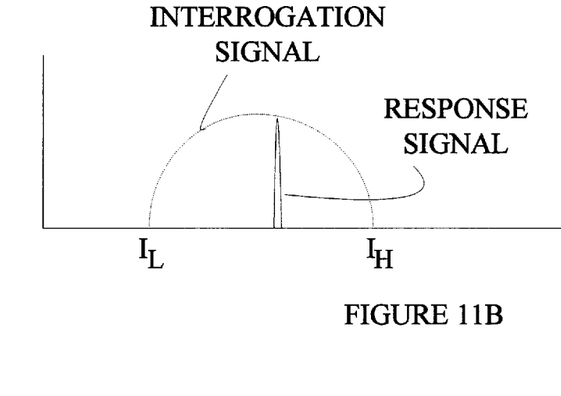
FIG. 11B illustrates the transformation of an interrogation signal obtained by passing the signal through a bandpass filter of the type shown in FIG. 10.

Bandpass filters may also be constructed from thin film bulk resonators. Refer now to FIG. 10 which is a cross-sectional view of bandpass filter 400. The electrically equivalent circuit is shown in FIG. 11A. Filter 400 is basically two FBAR filters that are mechanically coupled. A signal across electrodes 403 and 404 at the resonance frequency of PZ layer 401 will transmit acoustical energy to PZ layer 402. The mechanical oscillations in PZ layer 402 are converted to an electrical signal across electrodes 404 and 405 by the PZ material. Hence, a broadband interrogation signal such as that shown in FIG. 11B will be converted to a narrow band response signal at the resonant frequency of the resonators.

Figures 12A, 12B:
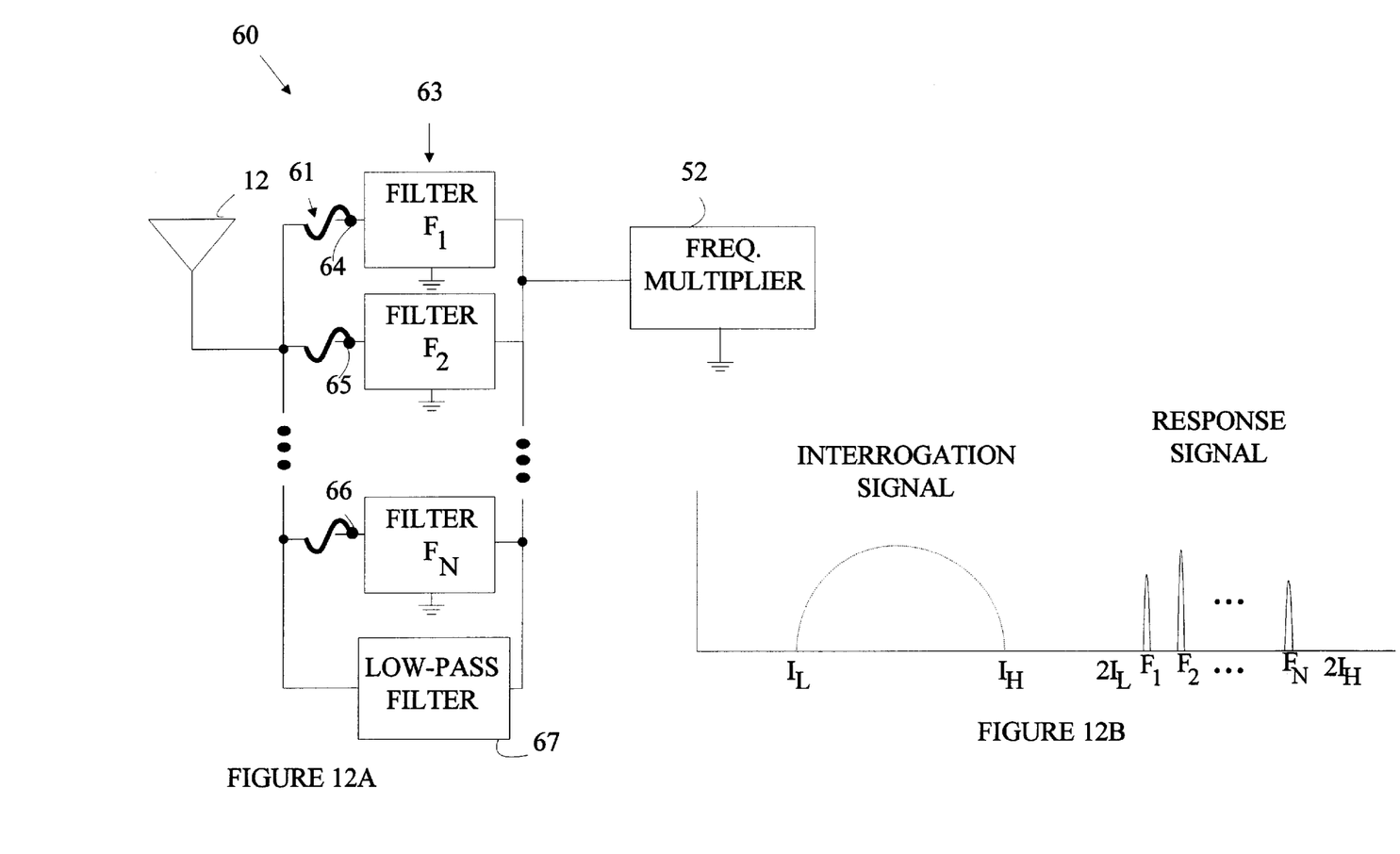
FIG. 12A is block diagram of an RF tag according to the present invention which is constructed from a plurality of bandpass filters and a low pass filter.
FIG. 12B illustrates the response of the RF tag shown in FIG. 12A to a broad-band interrogation signal.

One or more bandpass filters can be combined with an antenna and, optionally, a frequency multiplication circuit to form an RF tag which transmits an identification signal which includes a binary coded identification number. Refer now to FIG. 12A which is a block diagram of an RF tag 60 having N bandpass filters for implementing an N-2 bit identification code in a manner analogous to that described above with reference to FIGS. 8 and 9. Exemplary filters are shown at 63. Once again, it will be assumed that the interrogation signal is a broadband signal occupying the frequencies between $I_L$ and $I_H$. RF tag 60 utilizes bandpass filters having pass-bands between $2I_L$ and $2I_H$, the center frequency of the pass-band of the $i^{th}$ filter being denoted by $F_i$.

The interrogation signal is received by antenna 12 and coupled to frequency multiplier 52 by low-pass filter 67. Low-pass filter 67 has an upper cut-off frequency between $I_H$ and $2I_L$, Frequency multiplier 52 generates images of the interrogation signal at integer multiples of the interrogation frequencies. The higher-order interrogation image signals are blocked from returning to antenna 12 by low-pass filter 67. The portion of the image between $2I_L$ and $2I_H$ that overlaps the pass-bands of the filters returns to antenna 12. All other images of the interrogation signal created by frequency multiplier 52 are blocked. Accordingly, a response signal such as that shown in FIG. 12B is created if all of the filters are connected to antenna 12.

By selectively removing filters from antenna 12 utilizing the fuse circuits shown at 64–66, specific binary codes may be encoded. Once again, to provide a calibration signal for correcting for temperature and process variations, the lowest and highest filters are always connected. Hence, the frequency peaks generated $F_1$ and $F_N$ are always present.

It should be noted that varying the area of the piezoelectric layers in the filter results in a variation in the phase of the signal that is passed by the band-pass filter. Hence, the various peaks in the response signal can also be encoded with phase information to further encode identification information.

The above described embodiments of the present invention utilize the frequency of one or more resonators to provide the RF tag identification. The frequency is controlled primarily by controlling the thickness of the PZ layer. For any given PZ layer thickness, the resonance frequency can be shifted slightly by altering the area of the electrodes, and hence, the device. It should also be noted that the area of the electrodes determines the phase shift introduced into the band-passed signal in bandpass embodiments of the present invention. The simplest method for constructing devices with different resonant frequencies, however, is to utilize differences in the thickness of the devices.

In general, an FBAR or SBAR can be fabricated on a thin membrane. Since the device sits on this substrate, the device appears to be loaded with a mass that is related to the thickness of the membrane under the device. The loading of the device shifts the resonant frequency downward from the frequency that would be observed if the device was suspended in air. Accordingly, the resonant frequency of the device may be altered by changing the thickness of the membrane.

Figure 13:
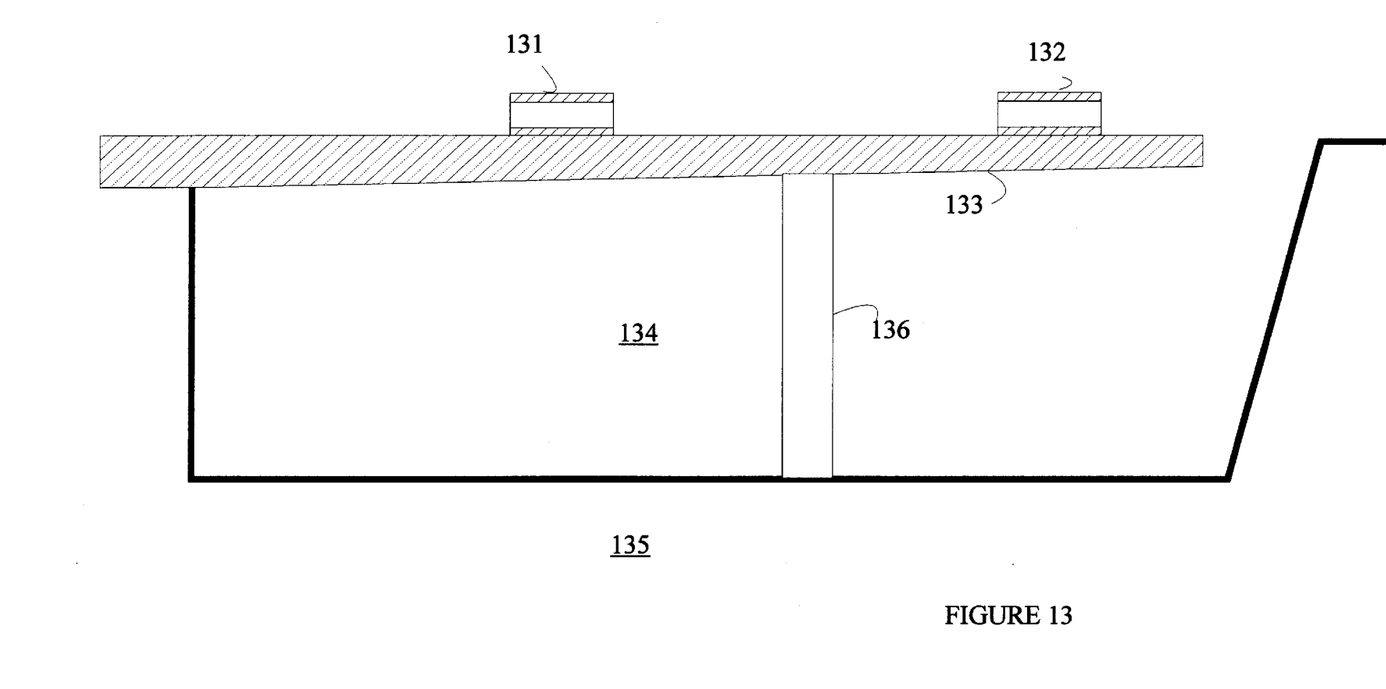
FIG. 13 is a cross-sectional view of two acoustical resonators constructed on a thin member having a tapered cross-section.

Refer now to FIG. 13 which is a cross-sectional view of two FBARs 131 and 132 constructed on a thin member 133 having a tapered cross-section. As will be explained in more detail below, member 133 is constructed by etching a cavity 134 in a substrate 135. The two FBARs are isolated from one another by a pillar 136 which extends to the bottom of the cavity.

Figure 14:
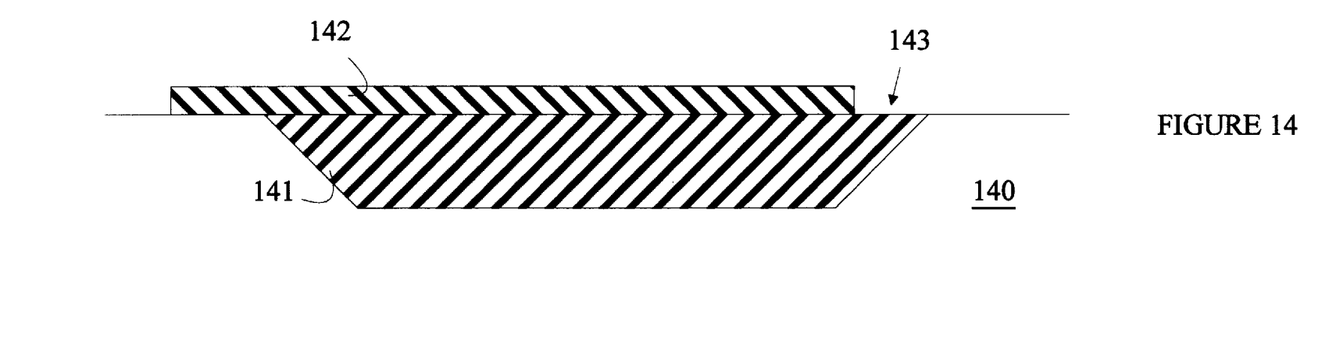
FIGS. 14 and 15 are cross-sectional views of a silicon substrate at various stages of construction of a tapered member such as that shown in FIG. 13.

The manner in which such a wedge is generated will now be explained in more detail with reference to FIGS. 14–15 which are cross-sectional views of a silicon substrate at various stages of construction of a tapered member such as that shown in FIG. 13. Referring to FIG. 14, a pit is formed in a silicon substrate 140 and filled with a low temperature phospho-silica-glass (PSG). The PSG is then planarized as shown at 141 and a layer of silicon nitride 142 is deposited and patterned over the filled pit such that an opening 143 at one end of the silicon nitride layer exposes part of the PSG.

Figure 15:
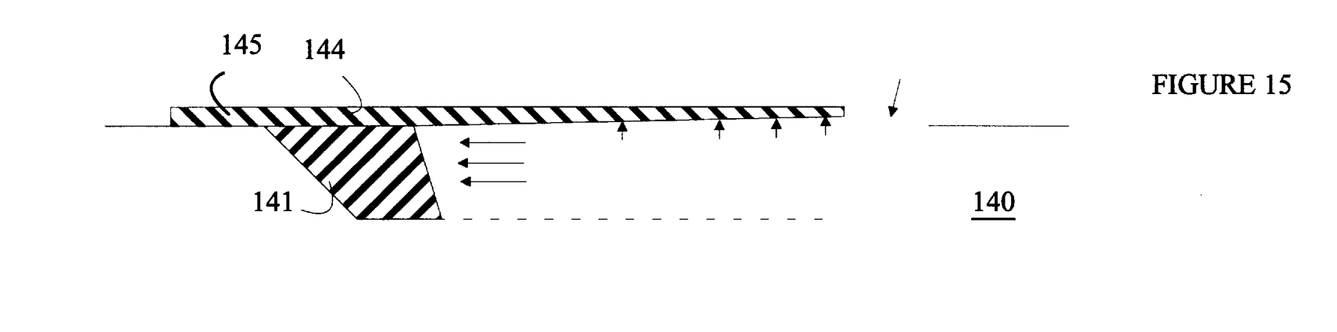

The substrate is then etched using a solution of HF and water as shown in FIG. 15. The etch rate of PSG is such that PSG is etched much faster than the silicon nitride. The ratio of the etch rates depends on the specific silicon nitride and PSG formulations; however, etch rate ratios of 1000:1 or greater are easily obtained. The portion of the silicon nitride layer nearest to opening 143 is exposed to the etchant much longer than the portions nearer to region 145. Hence, the resulting silicon nitride layer 144 will be tapered by an amount determined by the etch rate ratio.

As noted above, a pillar may be utilized to isolate the FBARs from one another on the supporting member. This can be accomplished by masking the silicon substrate so as to leave pillars in the pit shown in FIG. 13. The pillars must allow the etchant to move under the silicon nitride layer.

Figure 16:
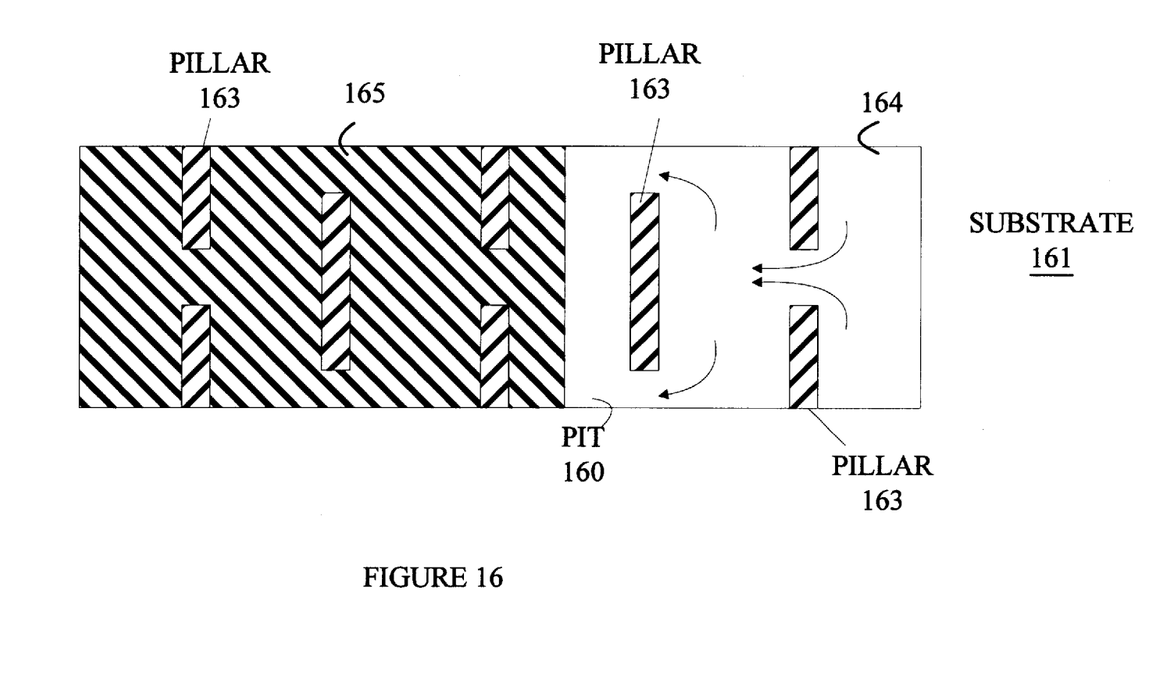
FIG. 16 is a top, schematic view of the etchant flow pattern under a silicon nitride layer when pillars are utilized as baffles for slowing the flow.

The pillars can also be used to increase the etch ratio by slowing the advance of the etchant front as shown in FIG. 16 which is a top, schematic view of the etchant flow pattern under a silicon nitride layer. The layer, which is not shown, is constructed over a pit 160 in substrate 161 having a plurality of pillars shown at 163. The etchant enters the pit at 164 and progressively dissolves the PSG fill 165. The flow of the etchant wave front is retarded by the pillars which restrict the flow of the etchant.

This approach of selectively "thinning" the SiN creates local thickness variation, and thus a multiplicity of frequencies for use as an RF tag as shown in FIG. 8 or FIG. 12A. In practice, such a device with its plurality of filters (or resonators) can be a template that is repeated across a wafer, yielding many RF-ID tags per silicon wafer. Uniqueness of ID can be accomplished by selectively connecting a unique set of filter/resonators via a fuse or other means. Thus, the present invention provides a method for constructing inexpensive RF ID tags.

Various modifications to the present invention will become apparent to those skilled in the art from the foregoing description and accompanying drawings. Accordingly, the present invention is to be limited solely by the scope of the following claims.

What is claimed is:

1. An RF tag comprising:

an antenna for receiving a RF signal having a frequency band between first and second frequencies; and a first acoustical resonator comprising a first electrode, a second electrode, and a first layer of piezoelectric material sandwiched between said first and second electrodes, said resonator having a resonant frequency F, said antenna being connected to one of said electrodes, said first acoustical resonator modifying said received RF signal, said modified RF signal being re-transmitted by said antenna.

2. The RF tag of claim 1 wherein F is between said first and second frequencies.

3. The RF tag of claim 1 further comprising:

a second acoustical resonator, comprising a first electrode, a second electrode, and a layer of piezoelectric material sandwiched between said first and second electrodes, said second resonator having a resonant frequency different from said resonant frequency of said first acoustical resonator.

4. The RF tag of claim 3 further comprising a selective coupling circuit for connecting said second acoustical resonator to said antenna.

5. An RF tag comprising:

an antenna for receiving a RF signal having a frequency band between first and second frequencies;

a first acoustical resonator comprising a first electrode a second electrode and a first layer of piezoelectric material sandwiched between said first and second electrodes, said resonator having a resonant frequency F, said antenna being connected to one of said electrodes and a frequency doubling circuit, wherein said first acoustical resonator forms a bandpass filter having a pass-frequency at F, and wherein F is greater than said second frequency.

6. The RF tag of claim 5 further comprising a low-pass filter having a cut-off frequency greater than said second frequency but less than F, said low-pass filter connecting said antenna to said frequency doubling circuit.

7. The RF tag of claim 5 wherein said bandpass filter alters the phase of a signal having frequency F passing therethrough.

8. The RF tag of claim 7 further comprising:

a second acoustical resonator, comprising a first electrode, a second electrode, and a layer of piezoelectric material sandwiched between said first and second electrodes, said second resonator forming a second bandpass filter having a pass-band, said second bandpass filter altering the phase of a signal in said pass-band by an amount different from the phase alteration provided by said first band-pass filter.

9. An RF tag comprising:

an antenna for receiving a RF signal having a frequency band between first and second frequencies;

a first acoustical resonator comprising a first electrode, a second electrode and a first layer of piezoelectric material sandwiched between said first and second electrodes, said resonator having a resonant frequency F, said antenna being connected to one of said electrodes and a frequency doubling circuit connected to one of said electrodes of said acoustical resonator and wherein F is greater than said second frequency.

10. The RF tag of claim 9 wherein said frequency doubling circuit comprises a zero bias diode.

11. An RF tag comprising:

an antenna for receiving a RF signal having a frequency band between first and second frequencies:

a first acoustical resonator comprising a first electrode, a second electrode, and a first layer of piezoelectric material sandwiched between said first and second electrodes, said resonator having a resonant frequency F, said antenna being connected to one of said electrodes;

a second acoustical resonator, comprising a first electrode, a second electrode, and a layer of piezoelectric material sandwiched between said first and second electrodes, said second resonator having a resonant frequency different from said resonant frequency of said first acoustical resonator and a support member having a variable thickness, said first and second resonators being supported on said support member at locations having different thickness.

12. An RF tag comprising:

an antenna for receiving a RF signal having a frequency band between first and second frequencies;

a first acoustical resonator comprising a first electrode, a second electrode, and a first layer of piezoelectric material sandwiched between said first and second electrodes, said resonator having a resonant frequency F, said antenna being connected to one of said electrodes;

a second acoustical resonator, comprising a first electrode, second electrode, and a layer of piezoelectric material sandwiched between said first and second electrodes; and a membrane, said first acoustical resonator contacting said membrane at a first location on said membrane and said second acoustical resonator contacting said membrane at a second location on said membrane, wherein said membrane has a different thickness at said first location than at said second location.

13. The RF tag of claim 12 further comprising a substrate and a support column, said membrane being suspended over said substrate and said support column contacting said substrate and said membrane, said contact with said membrane being located at a point between said first and second locations.

* * * * *